United States Patent
Katsumata et al.

(10) Patent No.: US 7,096,732 B2
(45) Date of Patent: Aug. 29, 2006

(54) SEMICONDUCTOR DEVICE WITH SHIELDING

(75) Inventors: Takashi Katsumata, Kariya (JP); Hirofumi Higuchi, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/022,224

(22) Filed: Dec. 20, 2001

(65) Prior Publication Data

US 2002/0073780 A1 Jun. 20, 2002

(30) Foreign Application Priority Data

Dec. 20, 2000 (JP) .............................. 2000-387619

(51) Int. Cl.
*G01P 15/125* (2006.01)
*G01P 3/483* (2006.01)
*H01L 29/84* (2006.01)

(52) U.S. Cl. .............................. 73/504.12; 73/504.14; 73/514.32; 257/414

(58) Field of Classification Search ............. 73/504.12, 73/504.14, 514.32; 257/414–420
See application file for complete search history.

(56) References Cited

U.S. PATENT DOCUMENTS

| | | | | | |
|---|---|---|---|---|---|
| 5,728,936 A | * | 3/1998 | Lutz | ...................... | 73/504.14 |
| 5,892,153 A | * | 4/1999 | Weinberg et al. | ........ | 73/504.16 |
| 5,955,668 A | * | 9/1999 | Hsu et al. | ................ | 73/504.12 |
| 5,969,225 A | * | 10/1999 | Kobayashi | ................ | 73/1.37 |
| 5,992,233 A | * | 11/1999 | Clark | ...................... | 73/514.35 |
| 6,070,464 A | * | 6/2000 | Koury et al. | ............. | 73/514.32 |
| 6,119,518 A | * | 9/2000 | Itou et al. | ................ | 73/504.16 |
| 6,240,780 B1 | * | 6/2001 | Negoro et al. | ........... | 73/504.12 |
| 6,327,907 B1 | * | 12/2001 | Park | ...................... | 73/504.12 |
| 6,445,195 B1 | * | 9/2002 | Ward | ........................ | 324/684 |
| 6,536,282 B1 | * | 3/2003 | Kipp et al. | ............. | 73/514.38 |
| 2001/0032508 A1 | * | 10/2001 | Lemkin et al. | .......... | 73/514.32 |
| 2002/0020219 A1 | * | 2/2002 | DeRoo et al. | ........... | 73/504.12 |

FOREIGN PATENT DOCUMENTS

JP  A-10-47971  2/1998

* cited by examiner

*Primary Examiner*—Hezron Williams
*Assistant Examiner*—John C Hanley
(74) *Attorney, Agent, or Firm*—Posz Law Group, PLC

(57) ABSTRACT

A semiconductor device includes gaps formed in a semiconductor substrate to provide an inner portion movable in x and y directions. Drive electrodes vibrate the inner portion in the x direction, and detection electrodes detect movement in the y direction generated when an angular velocity is applied thereto. Monitor electrodes generate monitor signals for monitoring movement of the inner portion in the x direction. Shield wires are provided between the drive and detection electrodes and the monitor electrodes to suppress capacitive coupling. Dummy electrodes adjacent to the output electrodes and capacitively coupled to the drive electrodes generate a dummy signal. Dummy signal wires are respectively connected to the dummy electrodes and to the circuit substrate. The dummy signal includes an induced component of a periodical signal and is supplied to the circuit substrate to cancel another induced component of the periodical signal in the drive and monitor signals.

17 Claims, 4 Drawing Sheets

SEMICONDUCTOR DEVICE WITH SHIELDING

BACKGROUND OF THE INVENTION

1. Field of the Invention

This invention relates to a semiconductor device with shielding.

2. Description of the Prior Art

A semiconductor device with shielding is known. U.S. Pat. No. 6,119,518 discloses an angular velocity sensor having a driving circuit and a detection circuit, wherein a feedback element and lines for detection elements are shielded from lines for drive elements.

SUMMARY OF THE INVENTION

The aim of the present invention is to provide a superior semiconductor device with shielding.

According to the present invention, a first aspect of the present invention provides a first semiconductor device comprising: a circuit substrate and a semiconductor substrate fixed with respect to the circuit substrate; said semiconductor substrate including a fixed portion and a movable portion, said movable portion being movable in a predetermined direction with respect to said fixed portion, said fixed portion being electrically insulated and including: an input electrode for inputting a periodical signal from said circuit substrate to said movable portion to vibrate said movable portion; and an output electrode for outputting a signal indicative of capacitive variation based on vibration of said movable portion in said predetermined direction toward said circuit substrate; an input wire for connecting said input electrode to said circuit substrate; an output wire for connecting said output electrode to said circuit substrate; and a shield wire connected to a constant potential at said circuit substrate to provide capacitive shielding between said input wire and said output wire.

According to the present invention, a second aspect of the present invention provides a semiconductor device based on the first aspect, wherein a top surface of said semiconductor substrate has a rectangular shape, and said input electrode and said output electrode are arranged at locations corresponding to different sides of said rectangular shape, respectively.

According to the present invention, a third aspect of the present invention provides a semiconductor device based on the first aspect, wherein said shield wire is grounded at said circuit substrate.

According to the present invention, a fourth aspect of the present invention provides a semiconductor device based on the first aspect, wherein said shield wire is arranged near either of said input electrode or said output electrode.

According to the present invention, a fifth aspect of the present invention provides a semiconductor device based on the first aspect, wherein said fixed portion further includes electrical insulation, a dummy electrode capacitively coupled to said input electrode near said output electrode for generating a dummy signal and said semiconductor device further comprises a dummy signal wire connected to said dummy electrode and said circuit substrate, said dummy signal including a component of said periodical signal induced and being supplied to said circuit substrate to cancel another component of said periodical signal induced in said signal.

According to the present invention, a sixth aspect of the present invention provides a semiconductor device based on the first aspect, wherein said movable portion is movable in another predetermined direction with respect to said fixed portion, said semiconductor device further comprising angular velocity detection means for detecting vibration of said movable portion in said another direction to determine an angular velocity around an axis perpendicular to said predetermined direction and another predetermined direction to generate said detection signal.

According to the present invention, a seventh aspect of the present invention provides a semiconductor device comprising: a circuit substrate and a semiconductor substrate fixed with respect to the circuit substrate; said semiconductor substrate including a fixed portion and a movable portion, said movable portion being movable in a predetermined direction with respect to said fixed portion, said fixed portion being electrically insulated and including: an input electrode for inputting a periodical signal from said circuit substrate to said movable portion to vibrate said movable portion; an output electrode for outputting a signal indicative of capacitive variation based on vibration of said movable portion in said predetermined direction toward said circuit substrate; a monitor electrode for monitoring capacitive variation based on vibration of said movable portion in said first predetermined direction and supplying a monitor signal to said circuit substrate; an input wire for connecting said input electrode to said circuit substrate; an output wire for connecting said output electrode to said circuit substrate; and a monitor wire for connecting said monitor electrode to said circuit substrate; and a shield wire connected to a constant potential at said circuit substrate to provide capacitive shielding between said input wire and said output wire and between said input wire and said monitor wire.

According to the present invention, an eighth aspect of the present invention provides a semiconductor device based on the seventh aspect, wherein said semiconductor plate is a rectangular plate, and said input electrode and said output electrode are arranged at locations corresponding to different sides of said rectangular plate, respectively.

According to the present invention, a ninth aspect of the present invention provides a semiconductor device based on the seventh aspect, wherein said shield wire is grounded at said circuit substrate.

According to the present invention, a tenth aspect of the present invention provides a semiconductor device based on the seventh aspect, wherein said shield wire is arranged near either of said input wire or said output wire.

According to the present invention, an eleventh aspect of the present invention provides a semiconductor device based on the seventh aspect, wherein said shield wire is arranged near either of said input wire or said monitor wire.

According to the present invention, a twelfth aspect of the present invention provides a semiconductor device based on the seventh aspect, wherein said fixed portion further includes electrical insulation, a dummy electrode capacitively coupled to said input electrode near said output electrode for generating a dummy signal, and said semiconductor device further comprises a dummy signal wire connected to said dummy electrode and said circuit substrate, said dummy signal including a component of said periodical signal induced and being supplied to said circuit substrate to cancel another component of said periodical signal induced in said signal.

According to the present invention, a thirteenth aspect of the present invention provides a semiconductor device comprising: a circuit substrate and a semiconductor substrate fixed with respect to the circuit substrate; said semiconductor substrate including a fixed portion and a movable portion, said fixed portion being fixed with respect to said circuit substrate and having supporting means for supporting said movable portion with movement in a predetermined direction with respect to said fixed portion, said movable portion being electrically connected to a predetermined potential; capacitive driving means for driving said movable portion, said capacitive driving means including a drive electrode included in said fixed portion for inputting a drive signal from said circuit substrate to said movable portion to vibrate said movable portion; detection means for detecting capacitive variation based on vibration of said movable portion caused by supplying said drive signal to said movable portion, said detection means including a detection electrode included in said fixed portion to supply a detection signal to said circuit substrate; and a shield wire pad arranged between said drive electrode and said signal electrode which is neighbor to said one of said drive electrodes; a drive signal wire for connecting said drive electrode to said circuit substrate; a detection wire for connecting said signal electrode to said circuit substrate; and a shield wire connected to said shield wire pad and a constant potential at said circuit substrate to provide capacitive shielding between said drive wires and said detection wire.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Prior to describing an embodiment of semiconductor device, a proto-type of semiconductor device developed by the inventors will be described.

Figure 4:
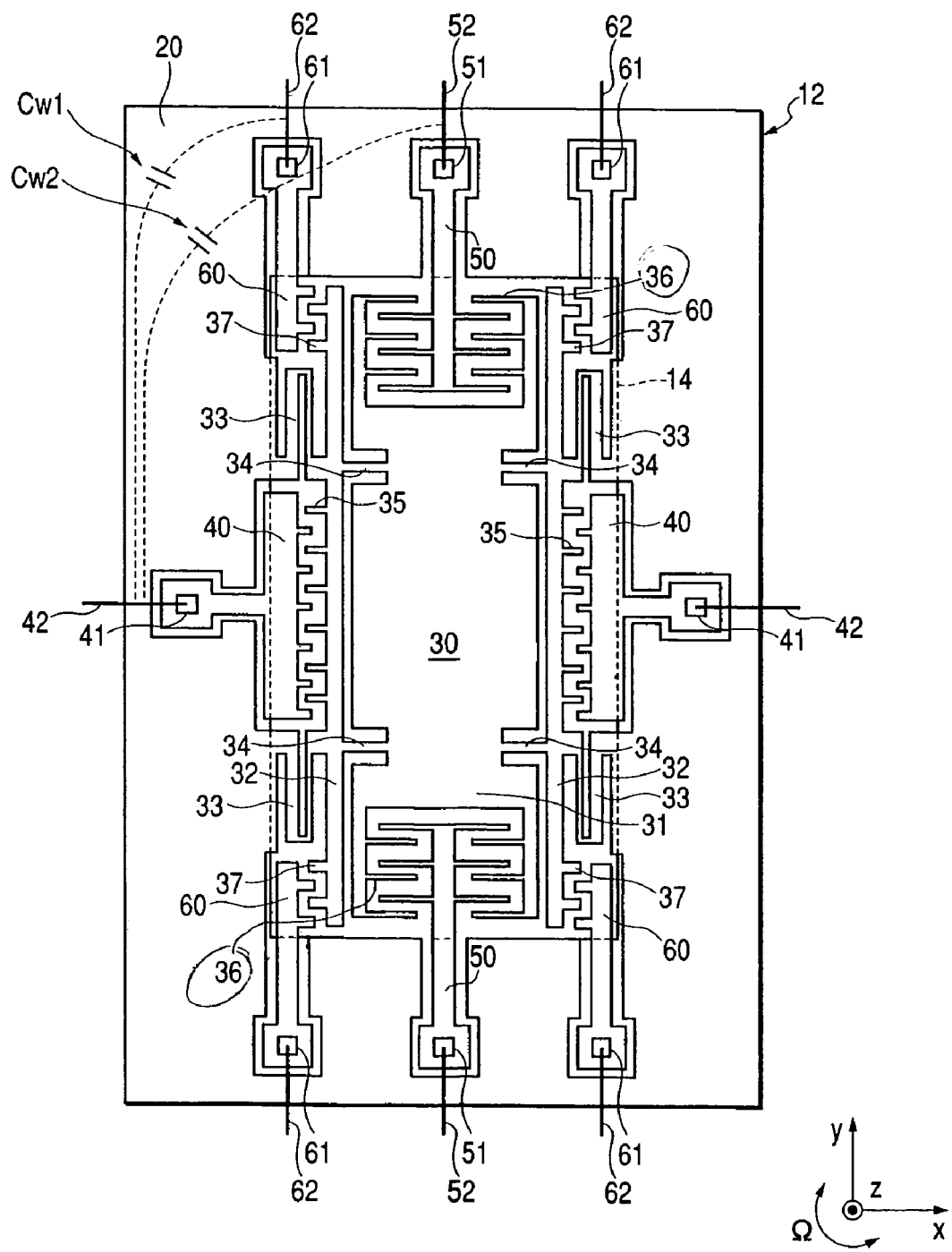
FIG. 4 is a plan view of the proto-type of the semiconductor device according to the present invention.

FIG. 4 is a plan view of the proto-type of semiconductor device according to this invention.

In FIG. 4, the proto-type of semiconductor device is formed with an SOI (silicon on insulator) substrate in which first and second silicon substrates are adhered with adhesive to each other through an oxide film by providing gaps, pads, and wires through well-known semiconductor processes.

The first silicon substrate 11 and the oxide film 13 are partially removed to have an opening 14 at the middle of the first silicon substrate 11 without removal of the second silicon substrate 12. Moreover, the first silicon substrate 11 is fixed to a circuit substrate K1 having a processing circuit.

The second silicon substrate 12 is processed to have gaps therein by micro-machining process or the like to provide following parts:

A movable portion 30 is formed to have a substantially rectangular plate shape above the opening 14 by forming gaps surrounding it except elastically connecting portions, i.e., driving beams 33 and detection beams 34. That is, the movable portion 30 is formed inside the frame 20.

The driving beams 33 have a U-shape to have degree of freedom in movement of the movable portion 30 only in the x direction with elastic deformation of the driving beams 33.

The detection beams 34 have a thin bar shape to provide a degree of freedom in movement of the movable portion 30 only in the y direction with elastic deformation of the detection beams 34. Thus, the frame 20 of the second substrate 12 supports the movable portion 30 with the driving beams 33 and detection beams 34 with movement of the movable portion 30 in predetermined x and y directions and is supported by the first substrate 11 on the circuit substrate K1.

At places where the edges (sides) of the movable portion 30 and the frame 20 face each other, teeth electrodes are formed as follows:

On edges of the opening 14 extending a longitudinal direction of the movable portion 30, drive (input) electrodes 40 having teeth are formed to supply driving signals to provide vibration of the movable portion 30 in the x direction. A portion thereof is formed on an oxide film such as the oxide film 13 shown in FIGS. 2 and 3, and the teeth 35 facing the teeth of drive electrodes 40 are formed at the edge of the movable portion 30 such that the teeth of the drive electrodes 40 interlace with the teeth 35.

At edges extending in a width (x) direction of the movable portion 30, detection electrodes 50 having teeth are formed. A portion of the detection electrode 50 is formed on the oxide film, and the teeth 36 facing with the teeth of the detection electrodes 50 are formed at the confronting edge of the movable portion 30 such that the teeth of the detection electrodes 50 interlace with the teeth 36. The detection electrode 50 generates a detection (output) signal based on capacitive variation in response to vibration in the y direction generated from vibration in the x direction when an angular velocity Ω around the z axis is applied to the movable portion 30 during vibration in the x direction.

At corners of the movable portion 30, monitor electrodes 60 having teeth are formed. A portion of the monitor electrode 60 is formed on the oxide film, and the teeth 37 facing with the teeth of the monitor electrode 60 are formed at the edge of the movable portion 30 such that the teeth of the monitor electrode 60 interlace with the teeth 37. The monitor electrode 60 generates a monitor signal indicative of capacitive variation due to vibration of the movable portion 30 in the x direction.

The electrodes 40, 50, and 60 are electrically connected to the circuit substrate with wires 42, 52, and 62.

When a drive signal (periodic signal) including an ac component such as a sine wave signal is applied between the drive electrodes 40, the movable portion 30 vibrates in the x direction with driving beams 33. The monitor electrode 60 generates the monitor signal indicative of variation in capacitance between the teeth of the monitor electrodes 60 and the teeth 37. The monitor signals are used to detect amplitude and frequency of the vibration of the movable portion 30 to control the drive signal.

During vibration of the movable portion 30, if an angular velocity Ω around the z axis is applied to the movable portion 30, a Coriolis force is developed in the y direction at the movable portion 30, so that vibration in the y direction is generated. This varies capacitance between the teeth of detection electrodes 50 and the teeth 36. The detection signal is used to detect the angular velocity Ω applied to the movable portion 30.

In this semiconductor device, though the detection signal is provided with a relatively small space, stray capacitances generated between wires 42, 52, and 62 affect the detection signal. That is, in FIG. 4, a stray capacitance Cw1 between wires 42 and 62, and a stray capacitance Cw2 between wires 42 and 52 are developed. That is, the wires 52 for the detection signal and wires 62 for the monitor signals are coupled to the wires 42 for the drive signals. Then, the drive signal component is superimposed (induced) on the monitor signal and the detection signal. The magnitude of the drive signal is very strong, so that this considerably affects the accuracy of the detection signal and the monitor signal.

Figure 1:
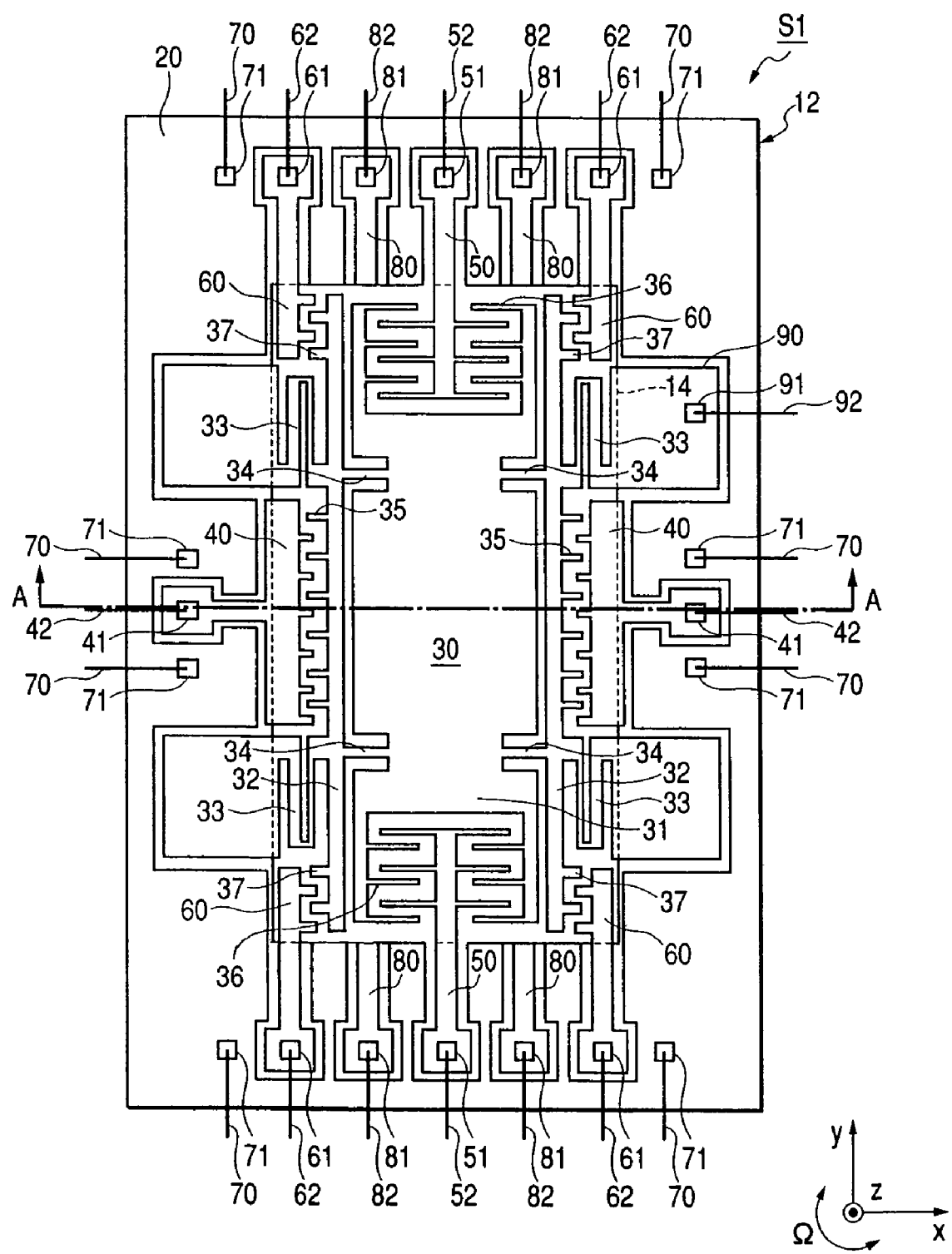
FIG. 1 is a plan view of a semiconductor device according to an embodiment of the invention.
Figure 2:
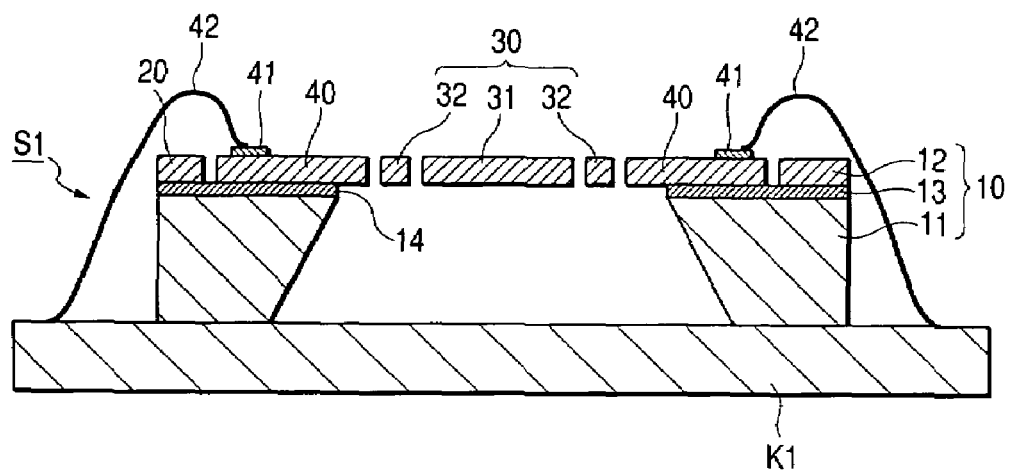
FIG. 2 is a sectional side elevation view of the semiconductor device taken on line A—A in FIG. 1.

FIG. 1 is a plan view of the semiconductor device according to an embodiment of this invention, and FIG. 2 is also a sectional side elevation view taken on line A—A in FIG. 1.

The semiconductor device shown in FIG. 1 has substantially the same structure as one shown in FIG. 4. That is, the first substrate 11 is supported by the circuit substrate K1. The first substrate 11 has the opening 14. The second substrate 12 and the electrodes are supported by the first substrate 11 through the oxide film 13. The movable portion is supported above the opening 14 by the drive beams 33. Forming gaps in the second substrate 12 with electrical insulation provides the drive electrodes 40, the detection electrodes, the monitor electrodes 60, the driving beams 33, the detection beams 34, and movable space around the movable portion 30.

The difference is that shield wires 70 and shield pads 71, and dummy electrodes 80 and dummy signal wires 82 are further provided. Moreover, plates 90 on the oxide film 13 support the driving beams 33 with insulation from the frame 20. On this plate 90, a pad 91 is formed and is connected to a potential V1 through a wire 92. This potential may be used to charge the capacitance for detection electrodes 50 and monitor electrodes 60. However, this plate may be grounded. In this case another circuit for charging the capacitances for the detection electrodes 50 and the monitor electrodes 60 is necessary.

On the drive electrodes 40, the detection electrodes 50, the monitor electrodes 60, and the dummy electrodes 80, pads 51, 61, 81 are formed with aluminum, respectively. Wires 42, 52, 62, 70, and 82 made of gold or the like are bonded to respective pads and respective pads (not shown) at corresponding places on the circuit substrate K1.

Here, the positions of respective electrodes are provided in consideration of capacitive coupling separation. That is, the drive electrodes 40 and the detection electrodes 50 (the monitor electrodes 60) are arranged at different sides of the inner edges of the frame 20 which are perpendicular to each other as shown in FIG. 1.

The shield wires 70 connected to the shield pads 71 are grounded on the circuit substrate K1, that is, the shield pad 71 and the shield wire 70 are maintained at a constant potential to reduce capacitive coupling. The shield pad 71 is arranged between the drive electrode 40 and the detection electrode 50 and between the drive electrode 40 and the monitor electrode 60. Similarly, the shield wire 70 is arranged between the drive wire 42 and the detection wire 52 and between the drive wire 42 and the monitor wire 62.

Moreover, two shield pads 71 with shield wires 70 are provided adjacent to each drive electrode 40 on both sides thereof. Further, along the side of the frame 20 extending in the x direction, the monitor electrode 60, the dummy electrode 80, the detection electrode 50, the dummy electrode 80, and the monitor electrode 60 are successively formed in this order. On both sides of these electrodes, the shield pads 71 with shield wires 70 are provided. In other words, the shield pad 71 is formed near either of the drive electrode 40 and/or the detection electrode 50 (monitor and dummy electrodes 60 and 80).

The angular velocity sensor S1 having the above-mentioned structure is supplied with the periodical driving signal such as a sine wave or a rectangular pulse signal from the circuit substrate K1 through the drive wires 42 and the drive electrodes 40. This generates electrostatic force between the teeth of the drive electrode 40 and the teeth 35. Thus, the movable portion 30 vibrates in the x direction with elastic support by the driving beams 33.

During this, variation of capacitance between the teeth of the monitor electrode 60 and the teeth 37 is detected to supply the monitor signal through the monitor pad 61 and the monitor wire 62 to the circuit substrate K1 to feedback the monitor signal to a self-oscillator 95 for generating the drive signal. That is, the generation of the drive signal is controlled on the basis of the detected monitor signal indicative the vibration of the movable portion 30 in the x direction.

Moreover, during the vibration, when an angular velocity $\Omega$ is applied to the movable portion 30 around the z axis, a Coriolis force is developed in y direction, so that vibration in the y direction is generated. This varies capacitance between teeth 36 and teeth at the detection electrodes 50. The capacitive variation is outputted as a detection signal which is used to detect the angular velocity $\Omega$ applied to the movable portion 30.

Here, the detection signal includes the driving signal induced component if the shield electrode 71 and the shield wires are not provided as mentioned above. Thus, the presence of the shield pads 71 and the shield wires 70 reduces the driving signal induced components in the detection signal because the stray capacitances between the drive wires 42 and the detection wires 52 are suppressed.

Actually, there are electric lines of force jumping over the shield wires 70 to some degree, so that it is not possible to perfectly suppress the stray capacitance. However, this structure provides a considerable improvement. More specifically, in the example shown in FIG. 4, the stray capacitance between the drive wire 42 and the detection wires 52 is considerably reduced. More specifically, in the example shown in FIG. 4, the stray capacitance between the drive wire 42 and the detection wire 52 without the shield wire 70 was 0.27 fF. On the other hand, in the structure shown in FIG. 1, the stray capacitance between the drive wire 42 and the detection wire 52 is reduced to a half of this value, more specifically, 0.15 fF. Therefore, the shield wires 70 can reduce the capacitive coupling between the drive wire 42 and the detection wires 52.

As mentioned above, according to this embodiment, the presence of the shield wires 70 prevents the drive signal component from entering the detection signal and the monitor signal through the capacitive coupling, i.e., stray capacitance, between the drive wire 42 and the detection wires 52 and between the drive wire 42 and the monitor wires 62.

Moreover, the monitor signal is accurately detected to control generation of the driving signal, so that the movable portion 30 can be accurately driven. Furthermore, this enables the distance between wires on the chip to be shortened, so that the whole circuit can be miniaturized.

In this embodiment, the positions of respective electrodes 40, 50, and 60 are determined regarding the second silicon substrate 12 having a rectangular plate shape as follows:

The drive electrode 40 and the detection electrode 50 are arranged at locations corresponding to different sides of the rectangular plate, respectively. Similarly, the drive electrode 40 and the monitor electrode 60 are arranged at locations corresponding to different sides of the rectangular plate, respectively. In this structure, the drive electrode 40 is remotely located from the detection electrode 50 and the monitor electrode 60.

As the result, the stray capacitance between the drive wire 42 and the detection wire 52 can be reduced. Similarly, the stray capacitance between the drive wire 42 and the monitor wire 62 can be reduced. Moreover, due to this position relation, the drive wire 42 and the detection wire 52 do not extend in parallel with each other, so that the stray capacitance is further reduced compared to the case if these wires extended in parallel with each other.

The shield wire 70 is maintained at a predetermined potential to remove charges in the stray capacitance between the drive wire 42 and the shield wire 70. More specifically, the shield wires 70 are grounded to maintain their potentials.

Moreover, it is favorable to place the shield pad 71 (wire 70) near either of the drive wire pad 41 or the detection wire pad 51 (the monitor wire pad 61) between the drive wire pad 41 and the detection wire pad 51 (the monitor wire pad 61). Thus, the shield wire pads 71 are provided and located near the drive wire pad 41, and the detection wire pad 51 (the monitor wire pad 61). The pads on the signal substrate K1 are correspondingly located, so that the shield wire 70 is located near the drive wire 40, the detection wire 50, and the monitor wire 60.

Electric force lines from one wire once spread and then converge at the other wire. Therefore, it is more favorable to locate the shield wire pads 71 (wire 70) near the wire pads (wires) to be shielded rather than locating the shield wire pads between the wire pads.

Figure 3:
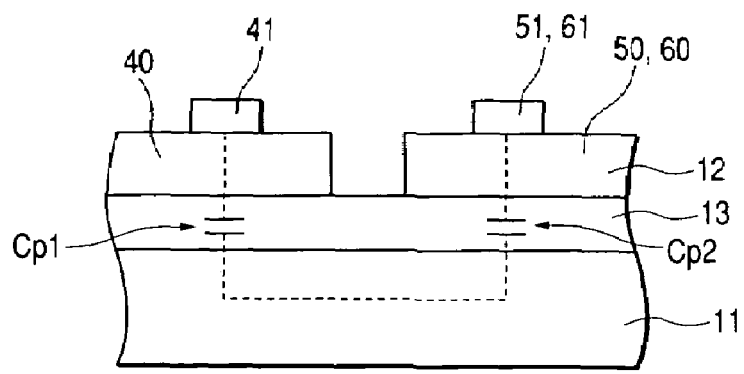
FIG. 3 is an illustration of a coupling relation in the circuit show in FIG. 1.

FIG. 3 is an illustration of a coupling relation in the circuit shown in FIG. 1. The drive electrodes 40, the detection electrodes 50, and the monitor electrodes 60 are supported by the first silicon substrate 11 through the oxide film 13 for insulation because the SOI substrate 10 has conductivity. Thus, as shown in FIG. 3, there are stray capacitances Cp1 and Cp2 between the drive electrode 40 and the first silicon substrate 11 and between the detection electrode 51 (the monitor electrode 61) and the first silicon substrate 11 through the oxide film 134. Then, because the first silicon substrate 11 is conductive, the final coupling between the drive electrode 40 and the detection electrode 50 (monitor electrode 60) is provided. This makes the driving signal enter the detection electrode 50 (monitor electrode 60) through the coupling as noise.

To reduce this effect, dummy electrodes 80 are formed on the oxide film 13 at the edge of the opening 14 near the detection electrodes 50 and the monitor electrodes 60 by providing gaps around them. The dummy electrodes 80 also have pads 81 formed with aluminum which are electrically connected to the circuit substrate K1 with wires 82.

The dummy electrode 80 is also capacitively coupled to the drive electrode 40 similarly, wherein the capacitance between the drive electrode 40 and the detection electrode 50 (monitor electrode 60) is substantially equal to that between the drive electrode 40 and the dummy electrode 80. This is because the area of the dummy electrode 80 is equalized to that of the drive electrode 40, and the thickness of the oxide film 13 is even. Accordingly, the driving signal induced component at the dummy electrode 80 is substantially equal to that at the detection electrode 50 or the monitor electrode 60. Then, the driving signal induced component at the dummy electrode 80 is used for canceling the drive signal induced component in the detection signal and the monitor signal.

Here, there is stray capacitance between the dummy signal wire 82 and the drive wire 42, so that in the absence of the shield wires 70, the drive signal induced component enters the dummy signal through the stray capacitance as noise or an offset.

However, in this embodiment, as shown in FIG. 1, the shield wire 70 is also provided between the dummy wire 82 and the drive wire 42, so that the stray capacitance between the dummy wire 82 and the drive wire 42 can be reduced. Accordingly the dummy signal is accurately generated, so that the drive signal induced components can be effectively removed.

This is more concretely described with assumption that the driving signal component induced through the oxide film 13 is cancelled by obtaining difference between the monitor signal 97 and the dummy signal 98. It is assumed that the stray capacitance between the monitor wire 62 and the drive wire 42 is Cw1, and the stray capacitance Cw3 between the dummy wire 82, the drive wire 42 is Cw3, and the magnitude of the driving signal is V.

Then, the driving signal induced through wires in the monitor signal is represented with charge Q1 as follows:

$$Q1 = Cw1 \times V$$

On the other hand, that in the dummy signal is represented with charge Q3 as follows:

$$Q3 = Cw3 \times V$$

In the difference signal between the monitor signal and the dummy signal, the driving signal component induced through the oxide film 13 can be substantially cancelled. However, the error in the driving signal component induced between the wires remains as Q1−Q3=(Cw1−Cw3).

In this condition, the shield wire 70 is further provided, so that the stray capacitances Cw1 and Cw3 are reduced, i.e., the term (Cw1−Cw3) is reduced. That is, the error in the difference regarding the drive signal component induced between the wires is reduced. Therefore, the driving signal induced component can be accurately removed.

As mentioned above, according to this embodiment, the dummy electrodes 80 are provided in addition to the shield wire 70, so that the driving signal component induced through the oxide film 13 and space between wires can be efficiently reduced.

Figure 5:
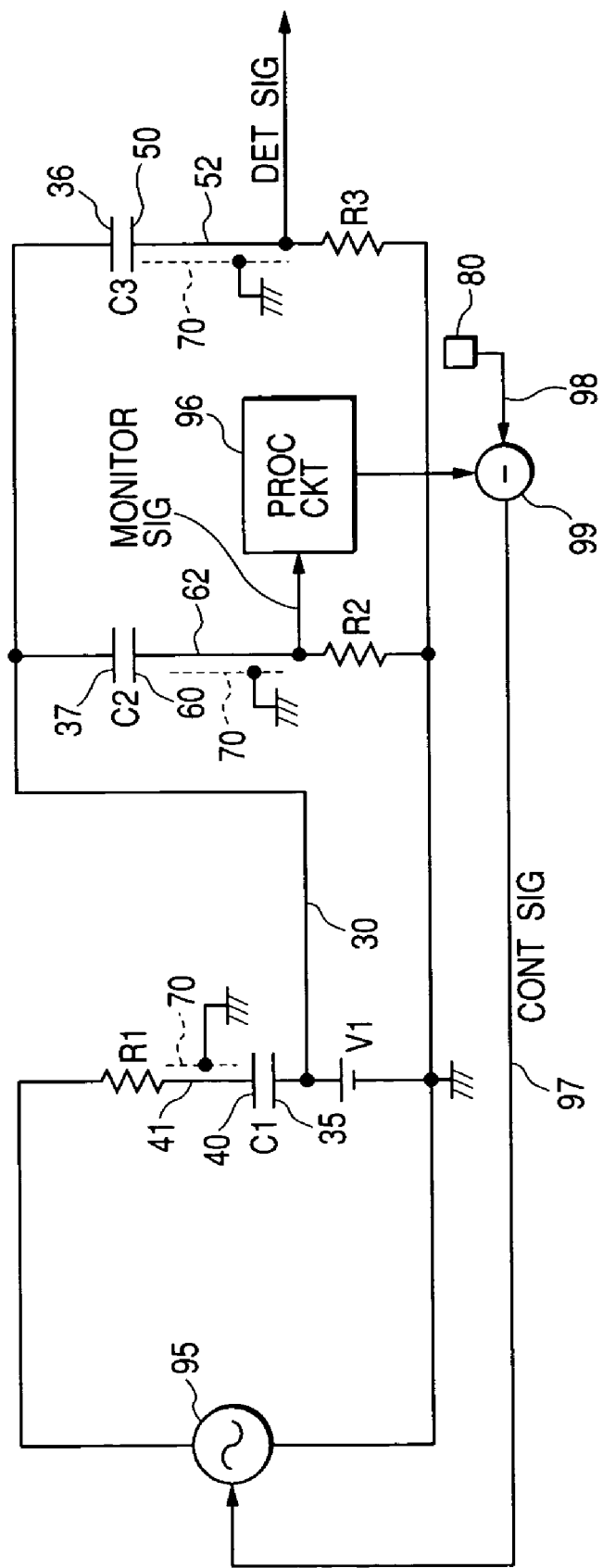
FIG. 5 is a schematic circuit diagram of a partial signal circuit for the angular velocity sensor according to the semiconductor device of the present invention.

In FIG. 5, the signal circuit includes the oscillator 95 for generating the sine wave signal which is applied to the drive electrode 40 of a variable capacitor C1 as the drive signal. The other electrode of the variable capacitor C1 is the teeth 35 which are connected to a predetermined potential V1 through the drive wire 42 which is guarded by the shield wire 70. The teeth 35 are driven by electrostatic force between these electrodes which sinusoidally varies in response to the sine wave drive signal, so that the movable portion 30 vibrates in the x direction.

The teeth 37 are supplied with the potential V1 and vibrate in the x direction also. The monitor electrode 60 and the teeth 37 form a variable capacitor C2, wherein the monitor electrode 60 is fixed, so that the capacitance of the variable capacitor C2 varies. This charges or discharges the charge on the monitor electrode 60. Then, the charge/discharge current flows through the monitor wire 62 and a resistor R2, wherein the shield wire 70 guards the monitor wire 62. The potential at the junction point between the capacitor C2 and the resistor R2 is processed by a processing circuit 96 to generate a detected monitor signal. The detected monitor signal is supplied to an operational amplifier 99. The operational amplifier 99 generates a control signal 98 supplied to the oscillator 95.

The oscillation in the oscillator 95 is controlled in accordance with the control signal 97.

The teeth 36 are supplied with the potential V1 and vibrates in y direction due to a Coriolis force generated by an angular velocity $\Omega$ around the z axis while the movable portion 30 vibrates. The detection electrode 50 and the teeth 36 form a variable capacitor C3, wherein the detection electrode 50 is fixed, so that the capacitance of the variable capacitor C3 varies. This charges or discharges the charges on the detection electrode 50. Then, the charge/discharge current flows through the detection wire 52 and a resistor R3, wherein the shield wire 70 guards the detection wire 52. The potential at the junction point between the capacitor C3 and the resistor R3 is outputted as the detection signal.

The component 98 of the drive signal is detected by the dummy electrode 80 and is supplied to the operational amplifier such that subtraction between the detected monitor signal and the dummy signal is carried out. Thus, the drive signal induced component in the monitor signal is removed. The drive signal induced component in the detection signal is similarly cancelled. However, this is omitted in FIG. 5. Moreover, there are two drive electrodes 40, two detection electrodes 50, and four monitor electrodes, and two dummy electrodes. However, the circuit shown in FIG. 5 only shows only one of respective electrodes and others are omitted because this schematic circuit diagram shows a portion of the circuit on the circuit substrate K1.

In FIG. 1, there are two drive electrodes 40 to symmetrically drive the movable portion 30. Moreover, there are two detection electrodes 50 to cancel noise component through differential operation. Furthermore, there are four monitor electrodes to monitor whether the movements of corners of the movable portion 30.

[Modification]

The number of shield wires 70 (the shield pads 71) provided between one of the drive wires 42 and the one of detection wire 52 (the monitor wires 62) may be one or more than two.

Moreover, in the above-mentioned embodiment, the shape of the opening 14 is rectangular. However, the shape of the opening 14 may be another shape.

In the above-mentioned embodiment, the opening 14 is formed to have a through hole. However, it is also possible to provide the opening 14 by forming a hollow portion by removing the oxide film 13 with the silicon substrate 11 being partially remained by sacrifice layer etching.

Moreover, the other substrates may be used instead the SOI substrate.

The above-mentioned semiconductor circuit structure can be used for other devices instead the angular velocity sensor if the device has the drive electrodes supplied with periodical driving signal to move the movable portion in a predetermined direction, an outputting electrode for outputting a detection signal indicative of the variation of the capacitance due to the movement, and the electrodes are electrically connected to the circuit substrate with wires. For example, this structure is applicable to an actuator for laser scanning including a semiconductor substrate.

What is claimed is:

1. A semi conductor device, comprising:
   a circuit substrate;
   a conductive substrate;
   an insulation film disposed on said conductive substrate;
   a semiconductor substrate including
     a movable portion that may be vibrated in a first direction;
     an input electrode disposed on said insulation film so as to face said movable portion through an open space, receiving periodic signal from said circuit substrate, and causing said movable portion to vibrate in said first direction, a first stray capacitor of a first capacitance being induced in said insulating film between said input electrode and said conductive substrate;
     an output electrode disposed on said insulation film so as to face said movable portion through an open space, and outputting vibration signal indicating vibration of said movable portion in a second direction, a second stray capacitor of a second capacitance being induced in said insulating film between said out electrode and said conductive substrate, a noise derived from the periodical signal being added to the vibration signal based on the first and second stray capacitors;
     a dummy electrode disposed on said insulation film so as to induce a third stray capacitor of a third capacitance in said insulating film between said dummy electrode and said conductive substrate in a manner that the third capacitance is substantially equal to the second capacitance induced by the output electrode, a dummy signal being generated in said dummy electrode from the periodical signal received in said input electrode based on the first and third stray capacitors; and
     a noise reducer which reduces the noise in the vibration signal by using the dummy signal of said dummy electrode.

2. The semiconductor device as claimed in claim 1, wherein a top surface of said semiconductor substrate has a rectangular shape, and said input electrode and said output electrode are arranged at locations corresponding to different sides of said rectangular shape, respectively.

3. The semiconductor device as claimed in claim 1, further comprising:
   an input which connects said input electrode and said circuit substrate to supply the periodic signal to said input electrode;
   an output wire which connects said output electrode and said circuit substrate to supply the vibration signal to said circuit substrate; and
   a shield wire which is disposed between said input wire and said output wire and is set at a constant potential to provide capacitive shielding between said input wire and said output wire.

4. The semiconductor device as claimed in claim 3, wherein said shield wire is grounded at said circuit substrate.

5. The semiconductor device as claimed in claim 3, wherein said shield wire is arranged adjacent to either of said input electrode or said output electrode.

6. The semiconductor device as claimed in claim 3, wherein said shield wire is arranged adjacent to either of said input wire or said output wire.

7. The semiconductor device as claimed in claim 1, wherein said movable portion is movable in a second direction perpendicular to said first direction, said semiconductor device further comprising angular velocity detection means for detecting vibration of said movable portion in said second direction to determine an angular velocity around an axis perpendicular to said first direction and second direction to generate said detection signal.

8. The semiconductor device as claimed in claim 1, wherein the noise reducer has a subtractor which subtracts a value of the dummy signal generated in the dummy electrode from a value of the vibration signal outputted from the output electrode and outputs a difference signal indicating a difference between the vibration signal and the dummy signal.

9. The semiconductor device as claimed in claim 8, wherein said shield wire is grounded at said circuit substrate.

10. The semiconductor device as claimed in claim 1, wherein said movable portion comprises an electrode facing said output electrode to provide a capacitance providing capacitive variation when said movable portion vibrates in said second direction.

11. A semiconductor device, comprising:
a circuit substrate;
a conductive substrate;
an insulation film disposed on said conductive substrate;
a semiconductor substrate including
a movable portion capable of vibrating in a first direction and vibrating in a second direction perpendicular to the first direction when an angular velocity around a third direction perpendicular to the first and second directions is applied to the movable portion;
a drive electrode disposed on said insulation film so as to face said movable portion through an open space, receiving a periodic signal from said circuit substrate, and causing said movable portion to vibrate in the first direction, a first stray capacitor of a first capacitance being induced in said insulating film between said drive electrode and said conductive substrate;
a detection electrode which is disposed on said insulation film so as to face said movable portion through an open space, and generates a detection signal indicating vibration of said movable portion in said second direction, a second stray capacitor of a second capacitance being induced in said insulating film between said detection electrode and said conductive substrate, a noise derived from the periodic signal being added to the detection signal based on the first and second stray capacitors;
a monitor electrode which is disposed on said insulation film so as to face said movable portion through an open space, and generates a monitor signal indicating vibration of said movable portion in said first direction, a third stay capacitor of the second capacitance being induced in said insulating film between said monitor electrode and said conductive substrate, a noise derived from the periodic signal being added to the monitor signal based on the first and third stray capacitors;
a dummy electrode disposed on said insulation film so as to induce a fourth stray capacitor of a third capacitance in said insulating film between said dummy electrode and said conductive substrate in a manner that the third capacitance is substantially equal to the second capacitance, a dummy signal being generated in said dummy electrode from the periodic signal received in said input electrode based on the first and fourth stray capacitors; and
a noise reducer which reduces the noise of the detection signal or the monitor signal by using the dummy signal of said dummy electrode.

12. The semiconductor device as claimed in claim 11, wherein said semiconductor substrate is a rectangular plate, and said drive electrode and a group of said detection and monitor electrodes are arranged at locations corresponding to different sides of said rectangular plate, respectively.

13. The semiconductor device as claimed in claim 11, further comprising:
a drive wire which connects said drive electrode and said circuit substrate to supply the periodic signal to said drive electrode;
a detection wire which connects said detection electrode and said circuit substrate to supply the detection signal to said circuit substrate;
a monitor wire which connects said monitor electrode and said circuit substrate to supply the monitor signal to said circuit substrate; and
a shield wire which is disposed between said drive wire and a group of said detection and monitor wires and is set at a constant potential to provide capacitive shielding between said drive wire and the group of said detection and monitor wires.

14. The semiconductor device as claimed in claim 13, wherein said shield wire is arranged adjacent to either said drive wire or both said detection wire and said monitor wire.

15. The semiconductor device as claimed in claim 11, wherein the noise reducer has a subtractor which subtracts a value of the dummy signal generated in the dummy electrode from a value of the detection or monitor signal outputted from the detection or monitor electrode and outputs a difference signal indicating a difference between the detection or monitor signal and the dummy signal.

16. The semiconductor device as claimed 11, wherein said movable portion comprises an electrode facing said monitor electrode to provide a capacitance providing capacitive variation when said movable portion vibrates in said first direction.

17. The semiconductor device as claimed in claim 11, wherein said movable portion comprises an electrode facing said detection electrode to provide a capacitance providing capacitive variation when said movable portion vibrates in said second direction.

* * * * *